United States Patent [19]
Tsujimoto

[11] Patent Number: 5,961,768
[45] Date of Patent: Oct. 5, 1999

[54] APPARATUS FOR APPLYING ADHESIVE SHEETS

[75] Inventor: Masaki Tsujimoto, Urawa, Japan

[73] Assignee: Lintec Corporation, Japan

[21] Appl. No.: 08/904,909

[22] Filed: Aug. 1, 1997

[30] Foreign Application Priority Data

Aug. 9, 1996 [JP] Japan ................................. 8-227859
Jun. 27, 1997 [JP] Japan ................................. 9-187413

[51] Int. Cl.[6] ........................................... B32B 31/00
[52] U.S. Cl. ..................... 156/285; 156/582; 156/583.1
[58] Field of Search .................................. 156/285, 297, 156/299, 580, 581, 582, 583.1

[56] References Cited

U.S. PATENT DOCUMENTS

| | | | |
|---|---|---|---|
| 4,787,951 | 11/1988 | Okamoto ................................. | 156/285 |
| 5,286,329 | 2/1994 | Iijima et al. ............................ | 156/297 |
| 5,352,110 | 10/1994 | Hayakawa et al. ..................... | 425/237 |
| 5,533,880 | 7/1996 | Hayakawa et al. ..................... | 425/328 |
| 5,637,177 | 6/1997 | Os ........................................... | 156/286 |

*Primary Examiner*—James Sells
*Attorney, Agent, or Firm*—Marger Johnson & McCollom, P.C.

[57] ABSTRACT

The adhesive sheet is a three-layered construction formed from a base material, a plyimide base resin adhesive and a release film, and is outputted from a sheet output control portion. A plate-shaped material comprised of semiconductor wafer is placed on a bonding table, and the wafer is heated by a heater unit. The bonding table is moved to the upper position, then a press roller is moved to press the adhesive sheet onto the heated wafer so as to bond the adhesive sheet to the wafer. At such time, another press roller presses the adhesive sheet. Then, a cutting unit is lowered to cut away any excess adhesive sheet material from the outer periphery of the wafer. Then, such excess adhesive sheet material is wound up in a sheet wind-up portion. In the next step, the rear surface of the wafer is stuck to a dicing tape, and then each chip is cut out. After this is done, each chip is picked up from the dicing tape and die bonded to a lead frame via the adhesive sheet.

20 Claims, 13 Drawing Sheets

APPARATUS FOR APPLYING ADHESIVE SHEETS

BACKGROUND OF THE INVENTION

1. Field of the Invention

The present invention relates to an apparatus for applying adhesive sheets to plate-shaped materials such as substrates, semiconductor wafers and the like.

2. Description of Prior Art

When a semiconductor device is manufactured in accordance with the prior art, a semiconductor wafer is cut into separate IC chips (dicing) which are then picked up and bonded to a lead frame (die bonding). When carrying out such die bonding, an adhesive is applied to each IC chip and then a thermocompression bonding is carried out to bond the chip to the lead frame so as to form a semiconductor device.

In recent years, the heat and mechanical properties of semiconductor devices have been improved by forming a resin film on the circuit surface and underside surface of the semiconductor wafer. Various resin films have been used, with examples including seal improving films for improving the seal between the sealant resin and the underside surface of the chip, passivation films, layer insulating films, α-ray cut-off films, pattern forming films, die pad adhesive films and the like.

Further, resin films are also formed on plate-shaped materials or substrates other than semiconductor devices, with examples including liquid crystal orientation films, printed circuit board protection films, X-ray exposure masking films and the like.

These resin films can be transformed from their normal liquid state to a dried film by applying such resins by means of spin coating or the like.

However, this method of applying a resin film with a spin coater wastes material, and this leads to a lower productivity. Further, because organic solvents for diluting materials vaporize in a clean room, this results in poor working environments in the clean room. Moreover, a great deal of skill is needed to form a homogeneous resin film.

SUMMARY OF THE INVENTION

The present inventor carried out study and research to improve the prior art method of bonding chips. As a result, the present inventor invented a method in which an adhesive sheet that includes a polyimide adhesive is first bonded to a semiconductor wafer, and then after dicing is carried out, each chip is picked up and directly bonded to a lead frame by means of adhesive sheet previously applied thereto.

Then, in order to utilize this method on mass production basis, it is needed to develop an apparatus for applying adhesive sheets to semiconductor wafer.

Thus, with a view toward overcoming to problems described above, it is an object of the present invention to provide an apparatus for applying adhesive sheets to plate-shaped materials such as semiconductor wafers or the like.

In the present invention, the plate-shaped material or the adhesive sheet, which includes a thermoplastic resin, is heated when such adhesive sheet is to be bonded to the plate-shaped material such as a semiconductor wafer.

Accordingly, by heating the plate-shaped material or the adhesive sheet, it is possible to reliably bond the adhesive sheet to the plate-shaped material.

DETAILED DESCRIPTION OF THE PREFERRED EMBODIMENTS

With reference to the appended drawings, a detailed description of an apparatus for applying an adhesive sheet according to the present invention will now be given.

Figure 1:
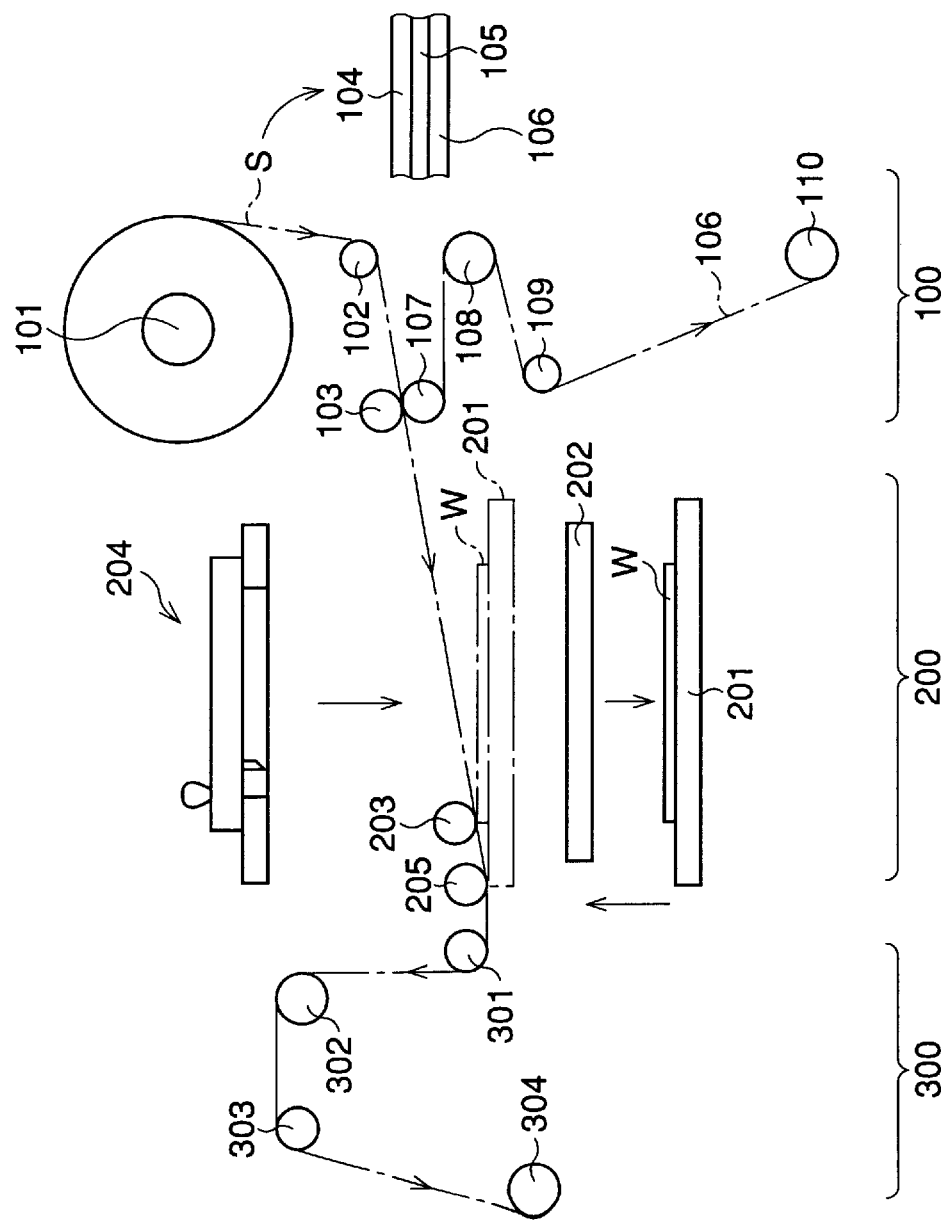
FIG. 1 is an schematic view showing the basic structure of an adhesive applying apparatus according to the present invention.

First, as shown in FIG. 1, the adhesive sheet applying apparatus according to the present invention is roughly constructed from a sheet output control portion 100, a sheet applying portion 200 and a sheet wind-up portion 300. In the sheet output control portion 100, a roll of adhesive sheet S is supported by an unwinding roller 101 and is outputted by an output control roller 103 via a guide roller 102. The adhesive sheet S is a three-layered construction formed from a base material 104, a thermoplastic resin adhesive 105 and a release film 106. The release film 106 is peeled off by a roller 107 (a peel plate can be used instead) and wound up on a wind-up roller 110 via a tension roller 108 and a guide roller 109.

In the sheet applying portion 200, a plate-shaped material comprised of a semiconductor wafer (hereafter referred to simply as "wafer") W with its front surface (i.e., pattern surface) facing down is placed on a bonding table 201 which acts as a wafer mounting means, and is positioned as shown by the dashed lines in FIG. 1. Before this is done, however, the wafer W is heated by a heater unit 202 which acts as a heating means. When the bonding table 201 is at the raised position, a press roller 203 (which acts as an applying means) is moved to press the adhesive sheet S onto the heated wafer W so as to bond the adhesive sheet S to the wafer W. At such time, the press roller 205 presses the adhesive sheet S so as to sandwich the adhesive sheet S between the press roller 205 and the bonding table 201. Then, a cutting unit 204 is lowered to cut away any excess adhesive sheet material from the outer periphery of the wafer.

Then, such excess adhesive sheet material is wound up in the sheet wind-up portion 300. Namely, the adhesive sheet S is wound up by a sheet wind-up roller 304 via a guide roller 301, a tension roller 302 and a guide roller 303.

In the next step, the rear surface of the wafer W, to which the adhesive sheet S is attached, is stuck to a dicing tape, and then each chip is cut out. After this is done, each chip is picked up from the dicing tape and die bonded to a lead frame via the adhesive sheet 105 bonded to the rear surface of each chip. In this case, the base material 104 of the adhesive sheet S remains on the dicing tape.

A thermoplastic resin, preferably one which is resistant to heat, is used for the adhesive 105. Examples of such a resin include polyimide based resins, polyamide based resins, fluorine based resins, polyester based resins, polyolefine based resins, polyethylene based resins, polyvinyl alcohol based resins, polyvinyl butyral based resins, vinyl acetate based resins, vinyl chloride based resins, methacrylic based resins, acrylic based resins, styrene based resins, cellulose based resins, vinyl ether based resins and the like.

In particular, the high heat resistant properties of fluorine based resins and polyimide based resins make them the preferred choice for the adhesive 105.

By using thermoplastic resins, the present invention is free from the aftercure process (i.e., curing process) required by the thermosetting resins used in the prior art, and this makes it possible to complete die bonding simply by applying the adhesive 105 under force to a heated lead frame, resulting in an effective bond having a high adhesive force.

Examples of materials which can be used for the base material 104 include engineering plastics, such as polyethylene terephthalate, polyethylene naphthalate. Further, a release treatment may be carried out between the base material 104 and the adhesive 105.

Next, a detailed description of the various parts of the adhesive applying apparatus will be given.

Figure 2:
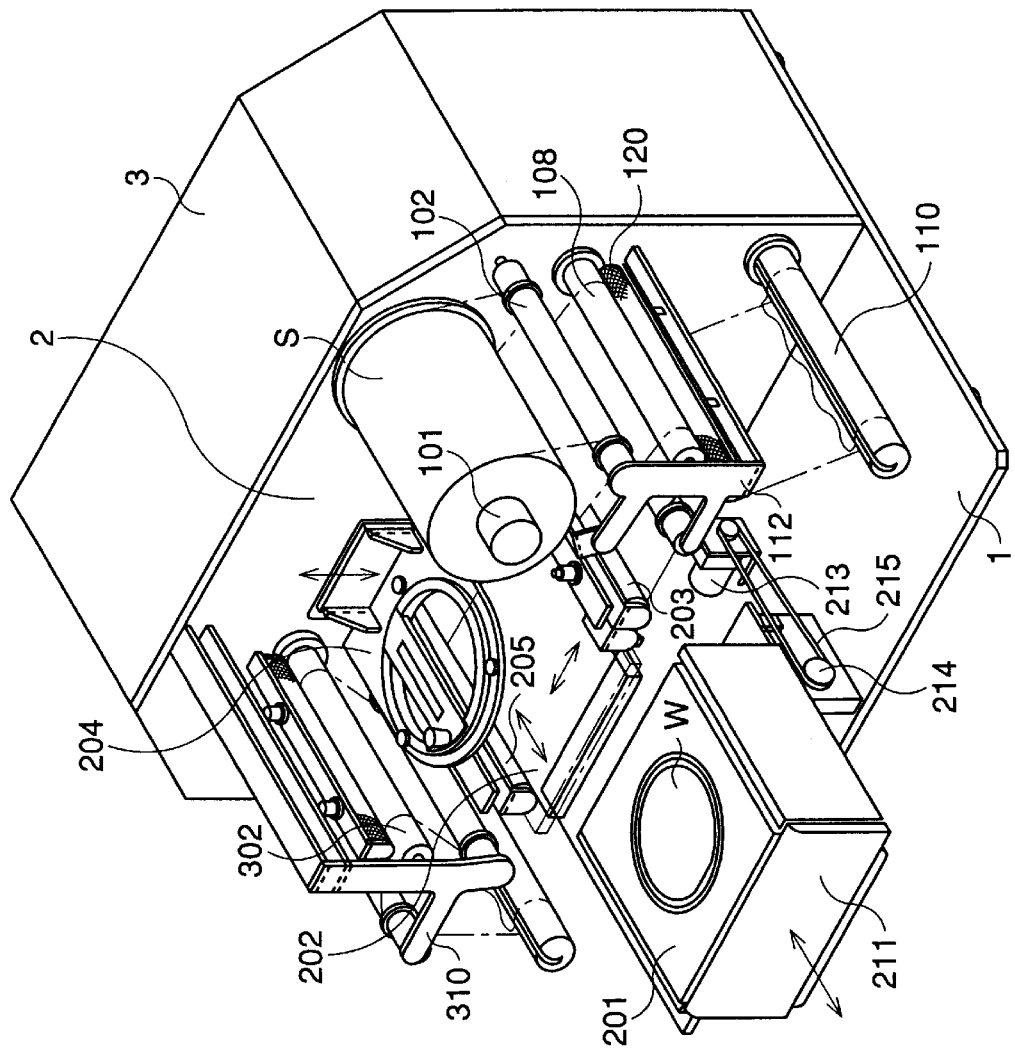
FIG. 2 is a perspective view of the apparatus of the present invention.

In this respect, as shown in the total perspective view of the adhesive applying apparatus in FIG. 2, a frame plate 2 is erected on a base 1, with the sheet output control portion 100, sheet applying portion 200 and sheet windup portion 300 being mounted on the frame plate 2. The rear portion of the frame plate 2 forms a box 3 which houses various drive systems.

In the sheet output control portion 100, an air cylinder 111, which can be operated to press and fix a protruding portion 111a against the core of the roll of the adhesive sheet S, is provided inside an unwinding roller 101. Fixed to the frame plate 2 is a roller support plate 112 which together with the frame plate 2 supports each of the rollers. A motor 113 is mounted on the rear surface of the frame plate 2 (i.e., the side of the box 3), with the rotational force from the motor 113 being transmitted to the output control roller 103 via pulleys 114, 115, a belt 116 and gear train 117. The output control roller 103 presses the adhesive sheet S so as to sandwich the adhesive sheet S between the output control roller 103 and the roller 107, whereby the adhesive sheet S is transported to the sheet applying portion 200.

On the other hand, the release film 106 which is separated from the adhesive sheet by the roller 107 is wound up by the wind-up roller 110 via the tension roller 108 and guide roller 109. Further, a roller 120 is in pressure contact with the tension roller 108, with the tension roller 108 being driven by a motor 121. The motor 121 also drives the wind-up roller 110 via a belt 122. In this respect, the release film 106 is used to protect the adhesive layer 105, and is therefore not an essential element. In other words, the adhesive applying apparatus of the present invention can also be used to apply adhesive sheets that do not have release films.

Next, the bonding table 201 is provided on a moving platform 210 so as to be movable up and down along guides 211, 211 (See FIG. 4) by the operation of the cylinder 212. Below the movable platform 210 is a belt 215 which is stretched between a motor 213 and a pulley 214, with such belt 215 being connected to a connection portion 210a of the movable platform 210. Accordingly, the bonding table 201 can be moved in the forward-backward direction (i.e., the left-right direction in FIG. 4) by the motor 213. In this respect, it should be noted that it is possible to use an actuator (cylinder or the like) in place of the motor 213.

Figure 6A:
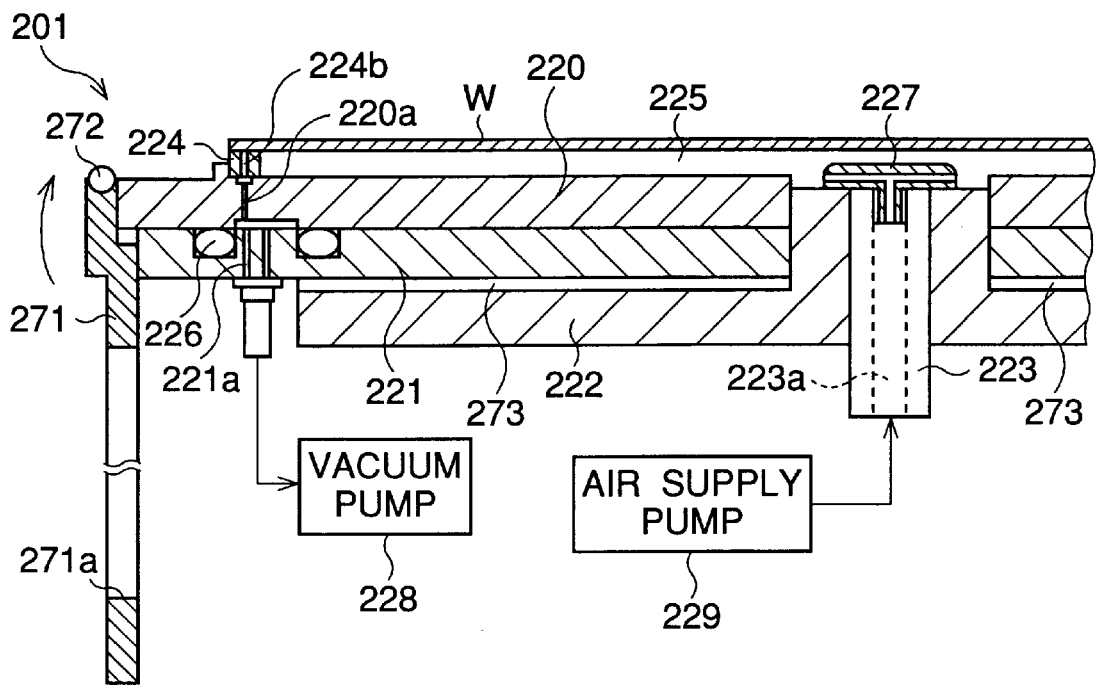
FIG. 6A is an enlarged cross-sectional view of the apparatus of the present invention and FIG. 6B is a top plan view of the annular member shown in FIG. 6A.
Figure 6B:
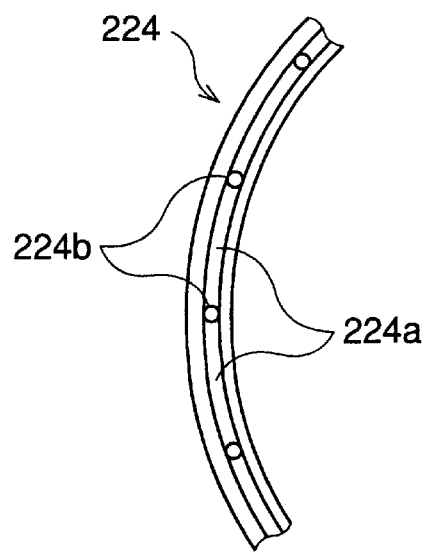

As shown in the enlarged cross-sectional view of the bonding table 201 in FIG. 6, the bonding table 201 is constructed from an upper plate 220, a lower plate 221 and a base plate 222 stacked together in an arrangement like that shown in the drawings. Bonded to the upper plate 220 is an annular or peripheral support member 224, having a double wall with a gap or groove 224a therebetween. The inside of the annular member 224 forms a concave portion 225, and the top of the annular member 224 supports a wafer placed with its front face (i.e., the pattern face) facing downward (as shown in FIG. 6) into the concave portion 225. The groove or gap 224a extends around the entire circumference of the upper edge of the annular member 224, and formed at prescribed spacings inside the groove 224a are a plurality of air holes 224b. Further, air holes 220a, 221a are formed, respectively, in the upper plate 220 and the lower plate 221 to communicate with the air holes 224b, whereby the outer periphery of the wafer W can be held in place by suction created by the negative pressure generated by a vacuum pump 228 after placing the wafer on the peripheral support member 224. Further, to prevent the leakage of air, the lower plate 221 is provided with an O-ring 226.

In this connection, it should be noted that the concave portion 225 is provided for the purpose of preventing the front surface of the wafer W from being damaged. Accordingly, in the case where it is alright to touch the front surface of the wafer W, there is no need to provide the concave portion 225 described above.

However, in the case where such a concave portion 225 is provided, it is possible for the central portion of the wafer to warp into a concave shape, and if this happens when an adhesive sheet is being applied, it is possible for air to get inbetween the wafer and the adhesive sheet. The present invention solves this problem by forming an air passage through the axle 223 to receive a nozzle 227 which supplies warm air (compressed air) from an air supply pump 229 to apply pressure on the wafer W.

In this way, by applying pressure to the central portion of the wafer W, the wafer W is prevented from warping, and this in turn prevents air from getting inbetween the adhesive sheet and the wafer, thus ensuring a secure application of the adhesive sheet. Furthermore, by providing warm air, the heated wafer W is prevented from dropping to a lower temperature.

Further, provided at the front edge of the bonding table 201 is a jig plate 271 which is used when mounting a wafer W, and for this purpose an opening 271a having the same outer circumferential shape as the wafer W is formed in the jig plate 271 and the jig plate 271 is rotatably mounted on an axle 272. With this arrangement, an operator can carry out precise positioning of the wafer W by first rotating the jig plate 271 in the direction of the arrow shown in FIG. 6 to place the jig plate 271 on top of the bonding table 201, and then placing the wafer W into the opening 271a.

Further, a heater 273 is arranged between the lower plate 221 and the base plate 222. Also, the upper plate 220, lower plate 221 and annular member 224 are made from a metal, such as aluminum or the like, which is heated by the heater 273, whereby the wafer W is maintained in a heated state.

Figure 7A:
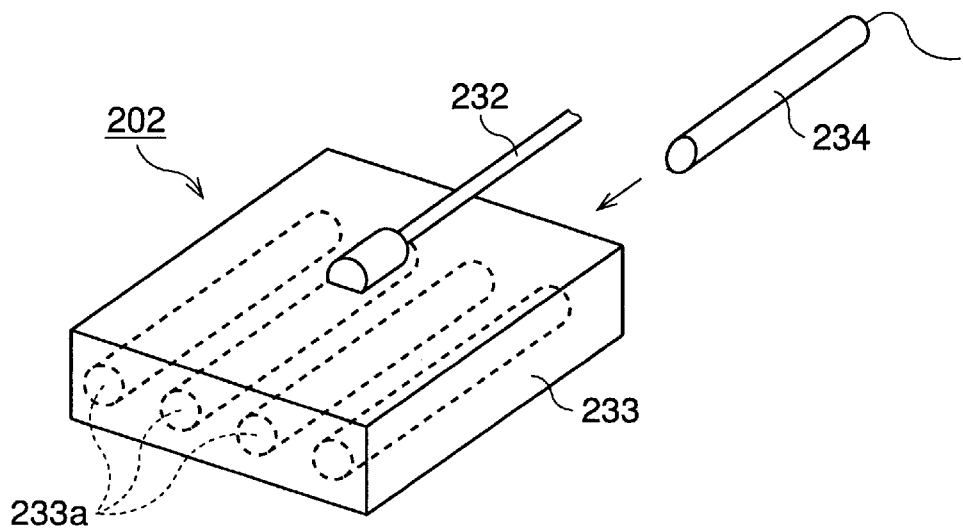
FIG. 7A is a perspective view of a heating unit and FIGS. 7B and FIGS. 7C are elevation and plan views thereof.
Figure 7B:
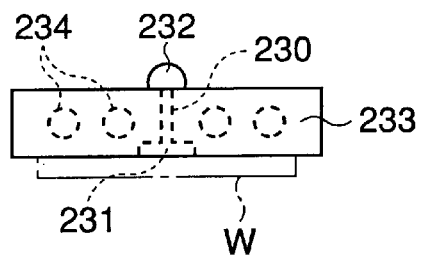
Figure 7C:
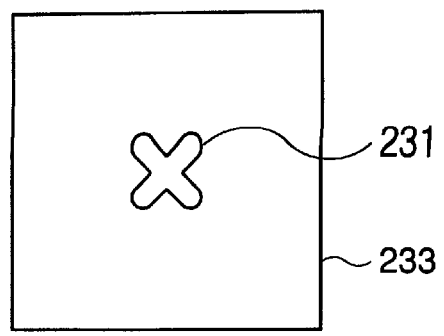

Next, FIG. 7 shows the construction of a heating unit 202. The heating unit 202 is made, for example, from an aluminum plate 233 having a plurality of holes 233a into which are inserted heaters 234 having a diameter of roughly 10 mm, for example. Further, a suction hole 230 is formed in the central portion of the aluminum plate 233 and a suction opening 231 is formed in the front surface of the aluminum plate 233 to enable the wafer W to be held by suction by means of negative pressure via a suction tube 232. In this way, after the wafer W is held by suction to the aluminum plate 233, a current is passed through the heater 234 to heat the entire rear surface of the wafer W to a prescribed temperature.

The prescribed temperature to which the wafer W is heated by the heater 234 is roughly in the range of 100° C.–250° C., with the preferred range being 120° C.–160° C.

As described above, by heating the wafer W, the adhesive 105 is also heated and thereby made more effective. Further, because heating is carried out while the wafer W is held by suction, there is very good contact between the aluminum plate 233 and the wafer W, and this creates an optimum heat transfer path, whereby it becomes possible to uniformly heat the wafer W in a short amount of time.

Figure 4:
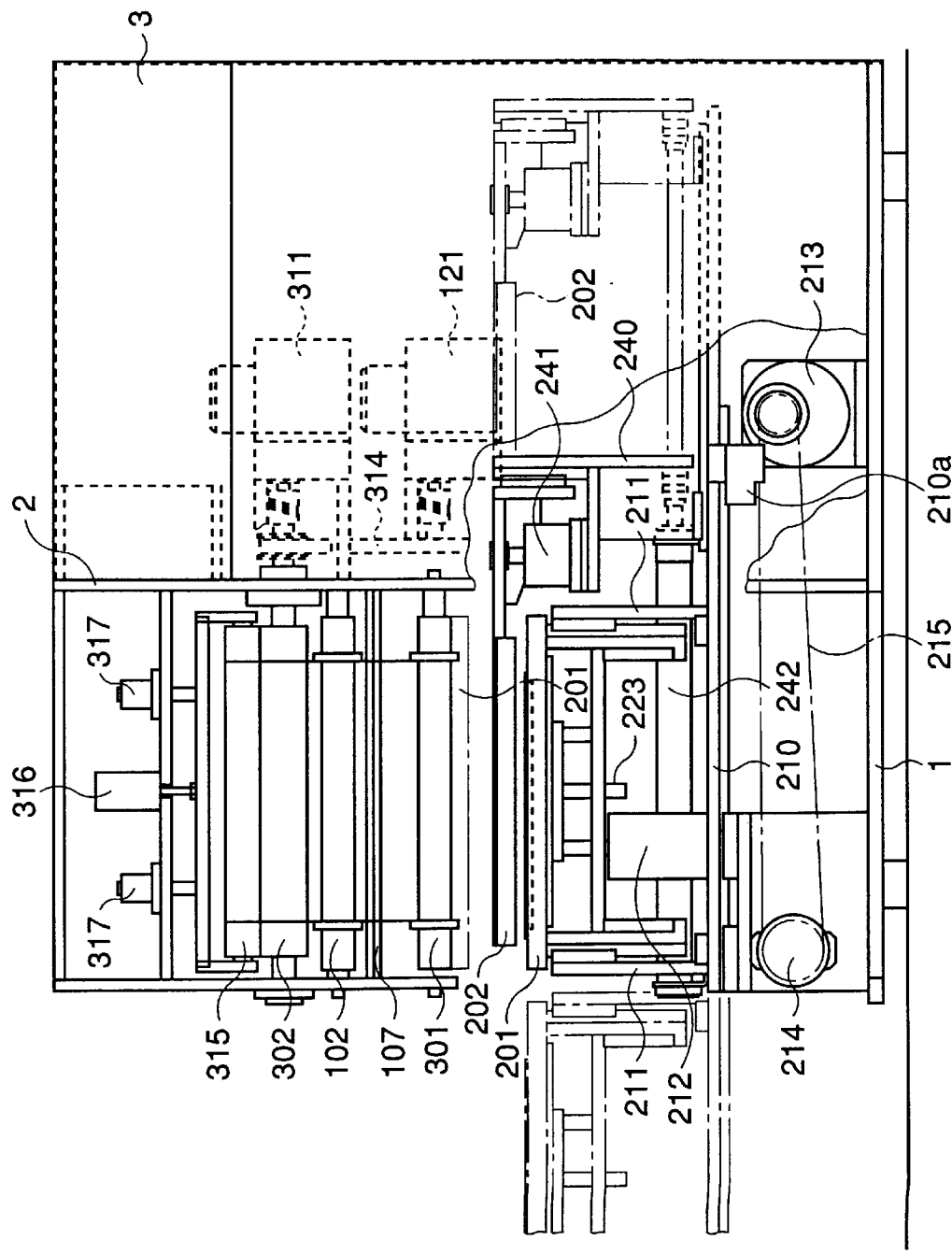
FIG. 4 is a side view of the apparatus of the present invention.

As shown in FIG. 4, the heating unit 202 is mounted via a cylinder 241 to a slide plate 240 which is provided on top of the moving platform 210 in a manner that enables the slide plate 240 to move in the forward-backward direction (i.e., the left-right direction shown in FIG. 4), with the cylinder 241 being used to move the heating unit 202 in the up-down direction. Further, a cylinder 242 is provided on the moving platform 210 to drive the slide plate 240 and the heating unit 202 in the forward-backward direction (i.e., the left-right direction in FIG. 4).

Figure 3:
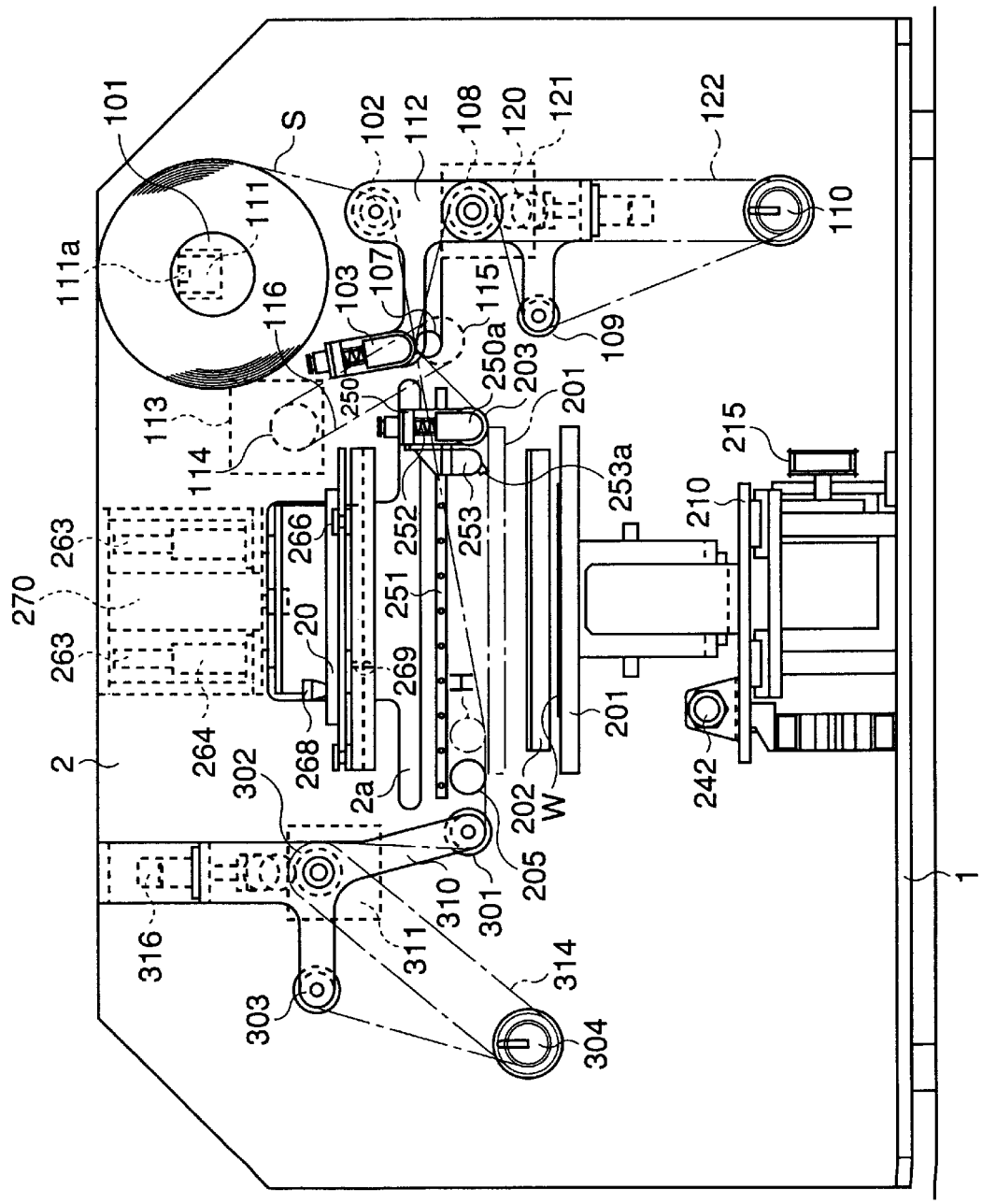
FIG. 3 is a front view of the apparatus of the present invention.
Figure 5:
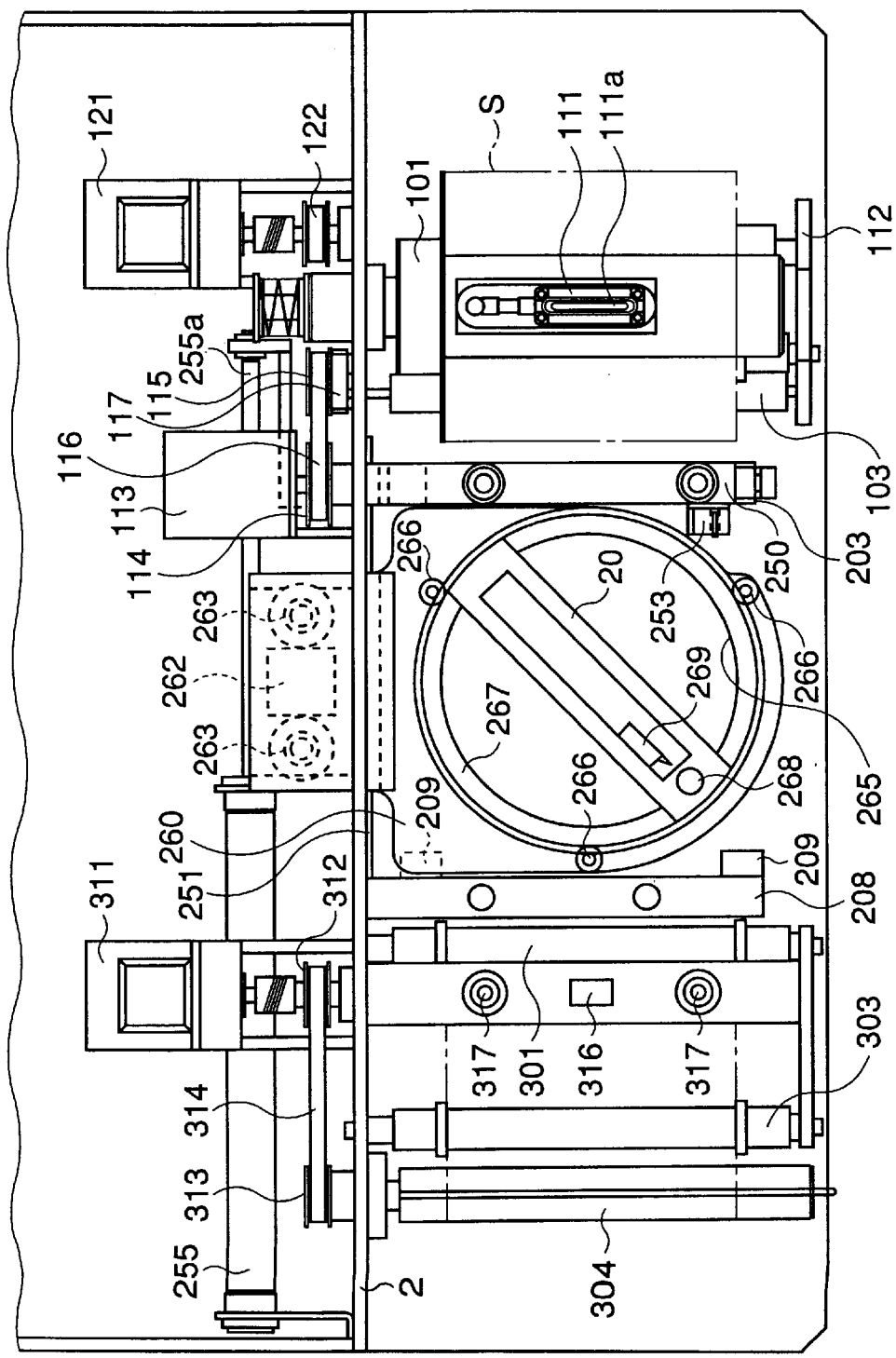
FIG. 5 is a planar view of the apparatus of the present invention.

Provided above the heating unit 202 is a press roller 203 which extends in the forward-backward direction (i.e., the up-down direction in FIG. 5). The press roller 203 is made from a heat resistant material, such as silicon rubber (having a hardness of 35°), and is mounted on a bracket 250 which is mounted on a rail 251 so as to be capable of movement in the left-right direction (as shown in FIGS. 3 and 5). The rail 251 is fixed to the frame plate 2. Mounted on the rear surface of the frame plate 2 (i.e., the side of the box 3) is a cylinder 255 (see FIG. 5) which includes a piston 255a connected to the bracket 250. Thus, by driving the cylinder 255, it is possible to move the press roller 203 in the left-right direction by a prescribed stroke. Further, the press roller 203 and the bracket 250 extend to the front of the frame plate 2 through an opening 2a formed in the frame plate 2.

The press roller 203 is mounted on a holder 250a which is mounted on the bracket 250 via a spring 252. Namely, the press roller 203 is normally biased downward by the spring 252, whereby the adhesive sheet S is kept at a prescribed compression. When on standby, the press roller 203 is held in the home position (the position H shown in FIG. 3) from which it is moved upstream (from the left to the right in FIG. 3) to apply the adhesive sheet S to the wafer W while still maintaining a prescribed compression of the adhesive sheet S.

The compression force exerted by the press roller 203 can be adjusted by the spring 252. One example of a possible range of compression values is 2 kgf–4 kgf, with the preferred value being about 3 kgf.

Further, an orientation flat portion cutter 253 is mounted to the front edge portion of the bracket 250. In this way, when the press roller 203 is moved in the left-right direction with the wafer W mounted so that its orientation flat portion is arranged forward, the orientation flat portion cutter 253 is also moved, whereby the adhesive sheet of the orientation flat portion of the wafer W is cut off.

Figure 8B:
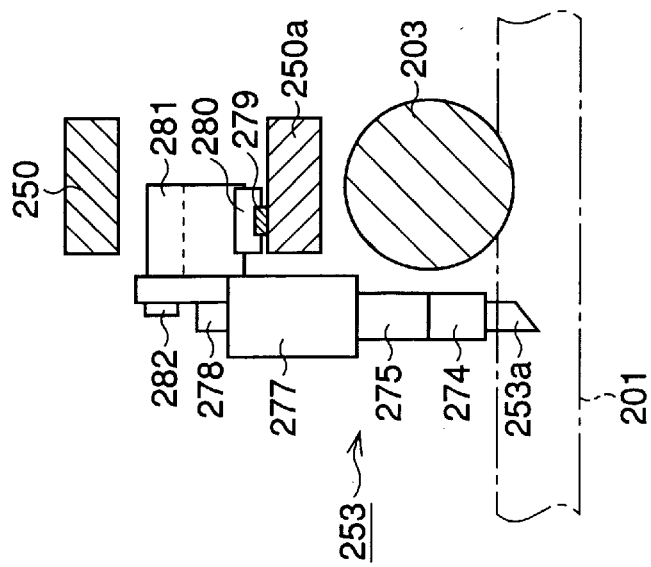
FIG. 8A is a detailed view of an orientation flat portion cutter and FIG. 8B is a cross-sectional view taken along line VIII—VIII in FIG. 8A.
Figure 8A:
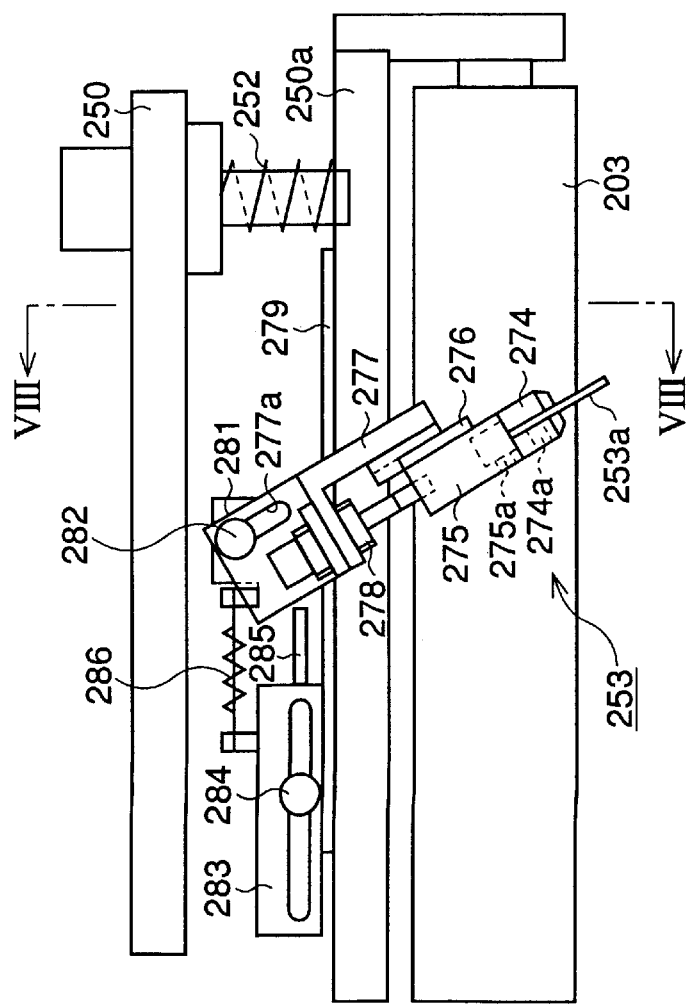

In this connection, FIG. 8(A) is a detailed drawing of the orientation flat portion cutter 253, and FIG. 8(B) is a cross-sectional view taken along line VIII shown in FIG. 8(A). The blade 253a of the cutter 253 is fixed to a head 274 by means of a screw 274a, and the head 274 is fixed to a body 275 by means of a screw 275a. The head 274 is rotatable with respect to the body 275 so as to make it possible to adjust the angle of the blade 253a with respect to the body 275. The body 275 is mounted on a holder 277 via a slider 276, and the holder 277 is connected to a cylinder 278 which is driven to slide the body 275 and blade 253a in a slanting direction (i.e., from the upper left to the lower right in FIG. 8(A)). The timing of such operation is carried out so that the cylinder 278 is driven when the cutter 253 is cutting off the orientation flat portion of the wafer W, at which time the blade 253a is moved downward, and then after the film of the orientation flat portion has been cut off, the cylinder 278 moves the blade 253a upward.

Further, the holder 250a is provided with a rail 279 to which a moving member 281 is slidably mounted via a slider 280. Formed in the holder 277 is a slut 277a through which is passed a screw 282 for mounting the holder 277 to the moving member 281. In this way, by adjusting the screw 282, it is possible to change the height and inclination angle of the holder 277. One example range of inclination angles with respect to the vertical direction is 0°–60°.

Slidably mounted to the rail 279 is a position setting member 283 which is fixed to the rail 279 by means of a screw 284. The position setting member 283 is equipped with a shaft 285, and both the position setting member 283 and the moving member 281 arc pulled by a tension spring 286 while kept at a fixed spacing by the abutment of the moving member 281 with the end of the shaft 285.

In this connection, by changing the position of the position setting member 283, it is possible to adjust the position of the cutter 253 in the widthwise direction of the adhesive sheet S (i.e., the left-right direction shown in FIG. 8(A)) in accordance with the size of the wafer W. At such time, by positioning the blade 253a a slight amount toward the inside of the orientation flat portion edge, it is possible to use the tensile strength of the spring 286 to apply force from the blade 253a to the orientation flat portion when the blade 253a is in contact with such portion.

In this way, when the blade 253a is inclined as shown in FIG. 8(A) and pressed, as described above, against the orientation flat portion, it becomes possible to cleanly cut off the adhesive sheet of such portion.

Figure 9B:
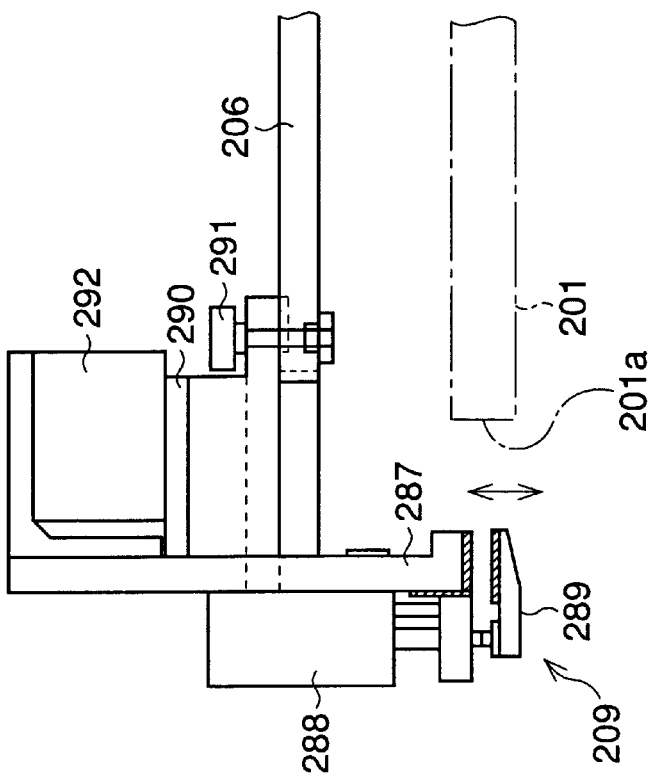
FIG. 9A is a detailed view of a press roller and chuck and FIG. 9B is a side view of the press roller shown in FIG. 9A.
Figure 9A:
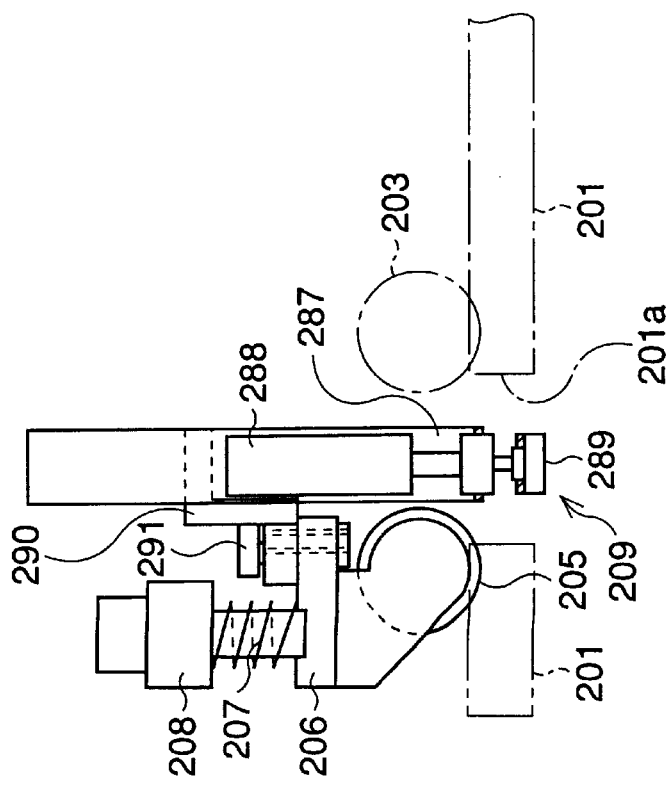

Next, FIG. 9(A) shows a press roller 205, and FIG. 9(B) shows a side view of the same. The press roller 205 is mounted to a holder 206 which is mounted to a bracket 208 via a spring 207, with the bracket 208 being fixed to the frame plate 2 (see FIG. 5). Provided on both edge portions of the holder 206 is a chuck 209 which holds the edge portions of the adhesive sheet S. The chuck 209 is equipped with an upper jaw member 287, a cylinder 288 which is mounted on the upper jaw member 287, and a lower jaw member 289 which is mounted on the tip of the piston of the cylinder 288, with the chuck being opened and closed by the movement of the cylinder 288.

Further a mounting bracket 290 is mounted to the holder 206 by means of a mounting screw 291, and a cylinder 292 is mounted to the mounting bracket 290, whereby the cylinder 292 moves the upper jaw member 287 in the widthwise direction of the adhesive sheet S. In this connection, the position of the chuck 209 in the widthwise direction of the adhesive sheet S can be adjusted by the mounting screw 291.

Now, when the bonding table 201 is raised to push the press roller 205 upward, the biasing force of the spring 207 fixes the adhesive sheet S between the bonding table 201 and the press roller 205. Then, before the bonding table 201 is raised, the chuck 209 grasps both edges of the adhesive sheet S and stretches the adhesive sheet in the widthwise direction thereof. In this way, the operation of the press roller 205 prevents the adhesive sheet S from slipping off the press roller 203 even when the press roller 203 is moved. In this regard, it should be noted the present invention is not limited to the use of a press roller, and it is possible to employ other adhesive sheet pressing means, such as a flat plate member or the like. Further, when the adhesive sheet S is being applied to the wafer W, because the cut-away adhesive sheet S is stretched in the widthwise direction by the chuck 209, it is possible to prevent wrinkles from forming by applying tension in just one direction (i.e., the machine direction). Further, as shown in FIG. 9(A), the chuck 209 is arranged inside a cut-away portion 201a formed in the bonding table 201 to make it easy for the chuck to grasp the adhesive sheet S.

Figure 10:
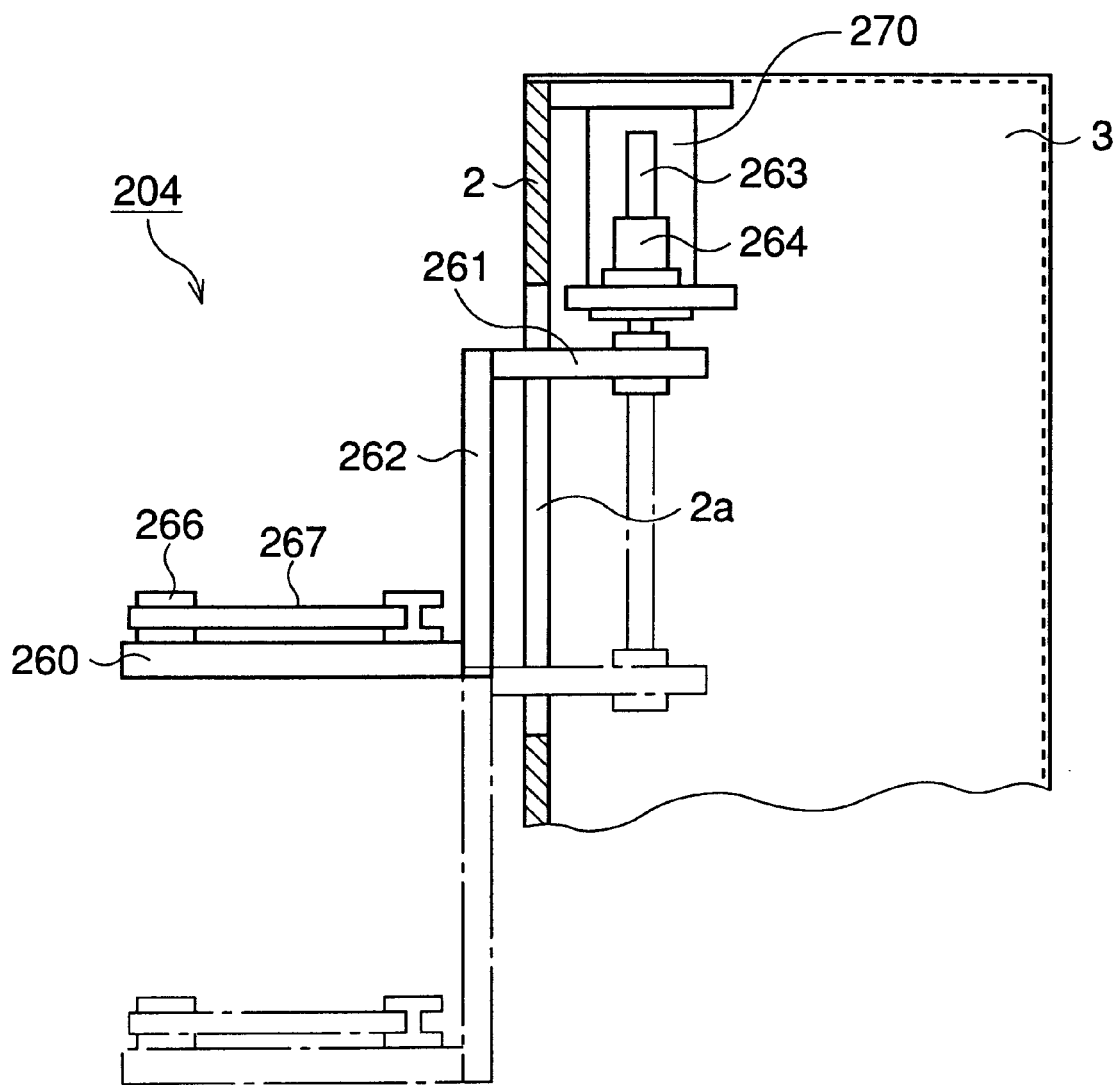
FIG. 10 is a side view of an outer circumference cutting unit.

Arranged above the press roller 203 is an outer circumference cutting unit 204. As shown in FIG. 10, the outer circumference cutting unit 204 is equipped with a lower plate 260, an upper plate 261 and a connecting plate 262 which connects the upper plate 261 to the lower plate 260, with the upper plate 261 passing through an opening 2a formed in the frame plate 2 and reaching the rear side of the frame plate 2, where the upper plate 261 is connected to the cylinder 270 and the shaft 263. The cylinder 270 is fixed to the ceiling of the box 3, and the shaft 263 is guided by a bush 264. In this regard, it should be noted that it is possible to use a guide rail or the like in place of the shaft 263 and bush 264.

Further, a circular shaped opening 265 is formed in the lower plate 260 (see FIG. 5), three pulleys 266 are provided around the opening 265, and a rotation ring 267 is rotatably mounted in the grooves of the pulleys 266. Mounted to the rotation ring 267 is a cutter platform 20, and mounted to the cutter platform 20 are a handle 268 and a cutter 269 (see FIGS. 3 and 5), such that when the handle 268 is used to rotate the rotation ring 267, the cutter 269 cuts off a circular piece of adhesive sheet from the outer circumference of the wafer W. And as shown by the dashed line in FIG. 10, the outer circumference cutting unit 204 is raised and lowered by the cylinder 270.

Figure 11:
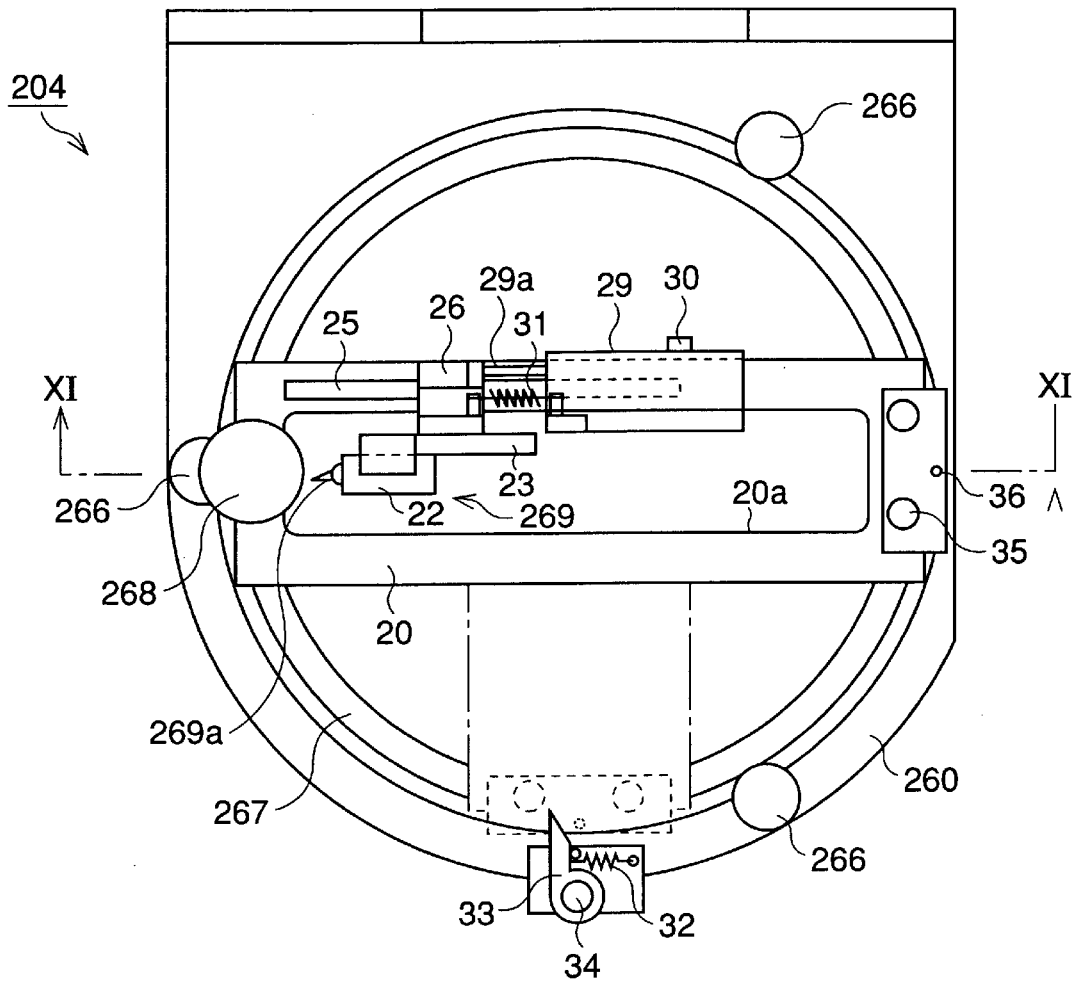
FIG. 11A is a detailed plan view of the outer circumference cutting unit and FIG. 11B is a cross-sectional view thereof taken along lines XI—XI.
Figure 11:
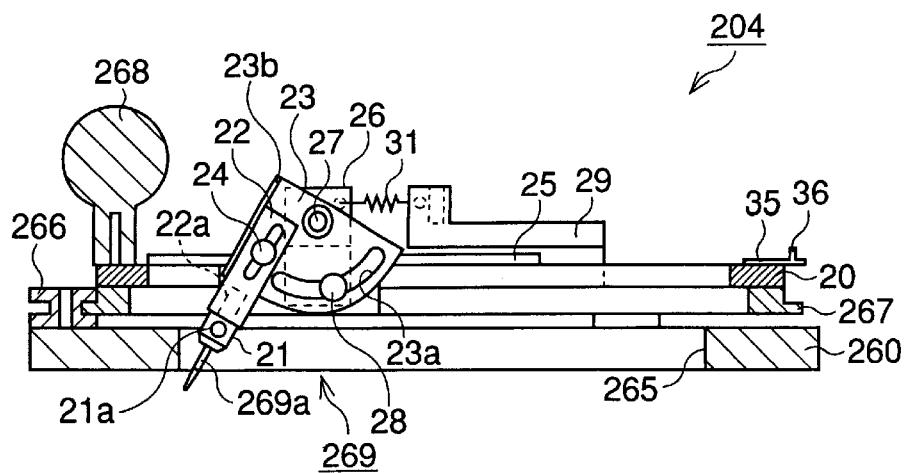

In this connection, FIG. 11(A) is a detailed planar view of the outer circumference cutting unit 204, and FIG. 11(B) is a cross-sectional view of the same taken along line XI in FIG. 11(A). As shown in these drawings, the cutter 269 is mounted in an opening 20a formed in the central portion of the cutter platform 20.

Further, a cutter blade 269a is fixed to a head 21 by a screw 21a, with the head 21 being fixed to a body 22 by a screw 22a. The head 21 can rotate with respect to the body 22, and it is possible to adjust the angle of the blade 269a with respect to the body 22. The body 22 is mounted to a holder 23 by means of a screw 24, and an edge portion of the holder 23 forms an erected plate 23b, whereby it becomes possible to adjust the height of the cutter blade 269a by sliding body 22 in a slanting manner in the up-down direction along the erected plate 23b.

Further, the cutter platform 20 is provided with a rail 25, and slidably mounted to the rail 25 is a moving member 26. The holder 23 is supported on the moving member 26 by means of an axle 27, and a screw 28 is passed through an arc-shaped slot 23a which is formed in the holder 23 to fix the holder 23 to the moving member 26, whereby the inclination angle of the cutter blade 269a can be changed (e.g., in the range 0°–60°) by rotating the holder 23 around the axle 27.

Slidably mounted to the rail 25 is a position setting member 29 which is fixed to the rail 25 by means of a screw 30. The position setting member 29 is equipped with a shaft 29a, and the position setting member 29 and moving member 26 are pulled by a tension spring 31, with the spacing therebetween being maintained by the abutment of the moving member 26 with the end of the shaft 29a.

In this way, by changing the position of the position setting member 29, it is possible to adjust the position of the cutter 269 in the radial direction of the wafer W in accordance with the size of the wafer W. At such time, the blade 269a is positioned slightly to the inside (toward the center of the wafer W) of the circumferential edge of the wafer W, whereby the biasing force from the spring 31 is used to press the blade 267a against the circumferential edge of the wafer W.

In this way, when the blade 269a is inclined as shown in FIG. 11(A) and pressed, as described above, against the circumferential edge of the wafer W by the spring 31, it becomes possible to cleanly cut off the adhesive sheet of such portion.

As shown in FIG. 11(A), a ratchet catch 33 is mounted to an axle 34 on the lower plate 260 by means of a spring 32, and a pin 36 is mounted to the mounting plate 35 on the cutter platform 20. In this way, the pin 36 moves and rotates together with the rotation ring 267, such that when the pin 36 is pushed past the ratchet catch 33, the pin 36 is thereafter restricted from rotating in the opposite direction by the ratchet catch 33. Namely, after the cutter 269 has completed one revolution, it is prevented from rotating in the opposite direction (the counterclockwise direction in FIG. 11(A)), thereby informing an operator of the completion of an outer circumferential cutting operation, thus, increasing the efficiency of the outer circumferential cutting operation.

Next, referring to FIGS. 3 and 4, a detailed description of the sheet wind-up portion 300 will be given. Namely, a roller support plate 310 is fixed to the frame plate 2, with various rollers (301, 302, 303) being supported by the roller support plate 310 and the frame plate 2. Further, a motor 311 for driving a tension roller 302 is provided at the rear of the frame plate 2 (in the box 3), with the rotational force of the motor 311 being transmitted to a wind-up roller 304 by means of pulleys and a belt 314. In this construction, a cylinder 316 presses a roller 315 against the tension roller 302 (see FIG. 4). Further, a biasing mechanism 317 (such as a shaft, shaft support bush, shaft-mounted spring and the like) is provided on both sides of the cylinder 316 to hold the roller 315 against the tension roller 302.

Figure 12:
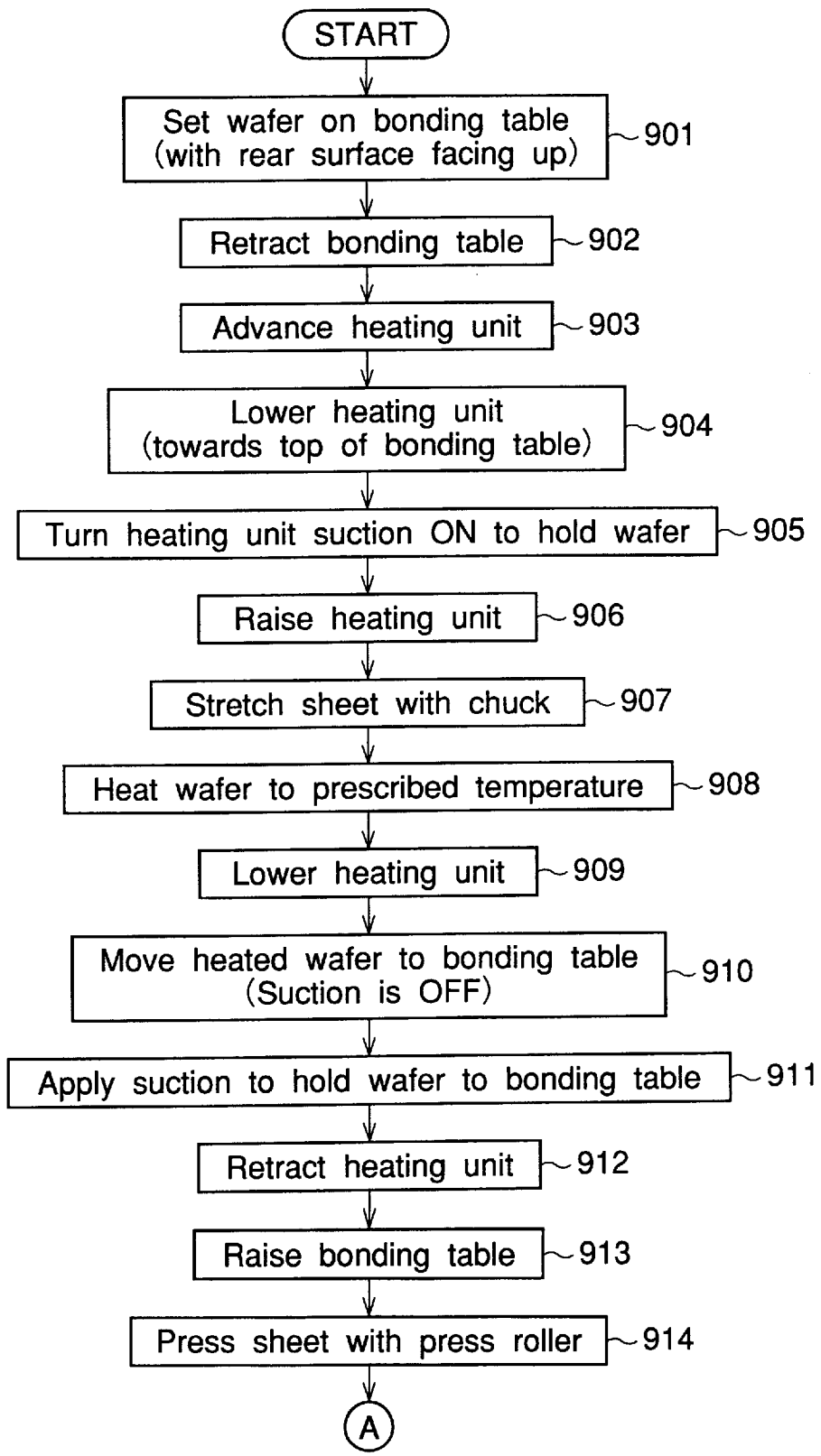
FIGS. 12 and 13 show a flow chart outlining the operation of the adhesive applying apparatus according to the present invention.
Figure 13:
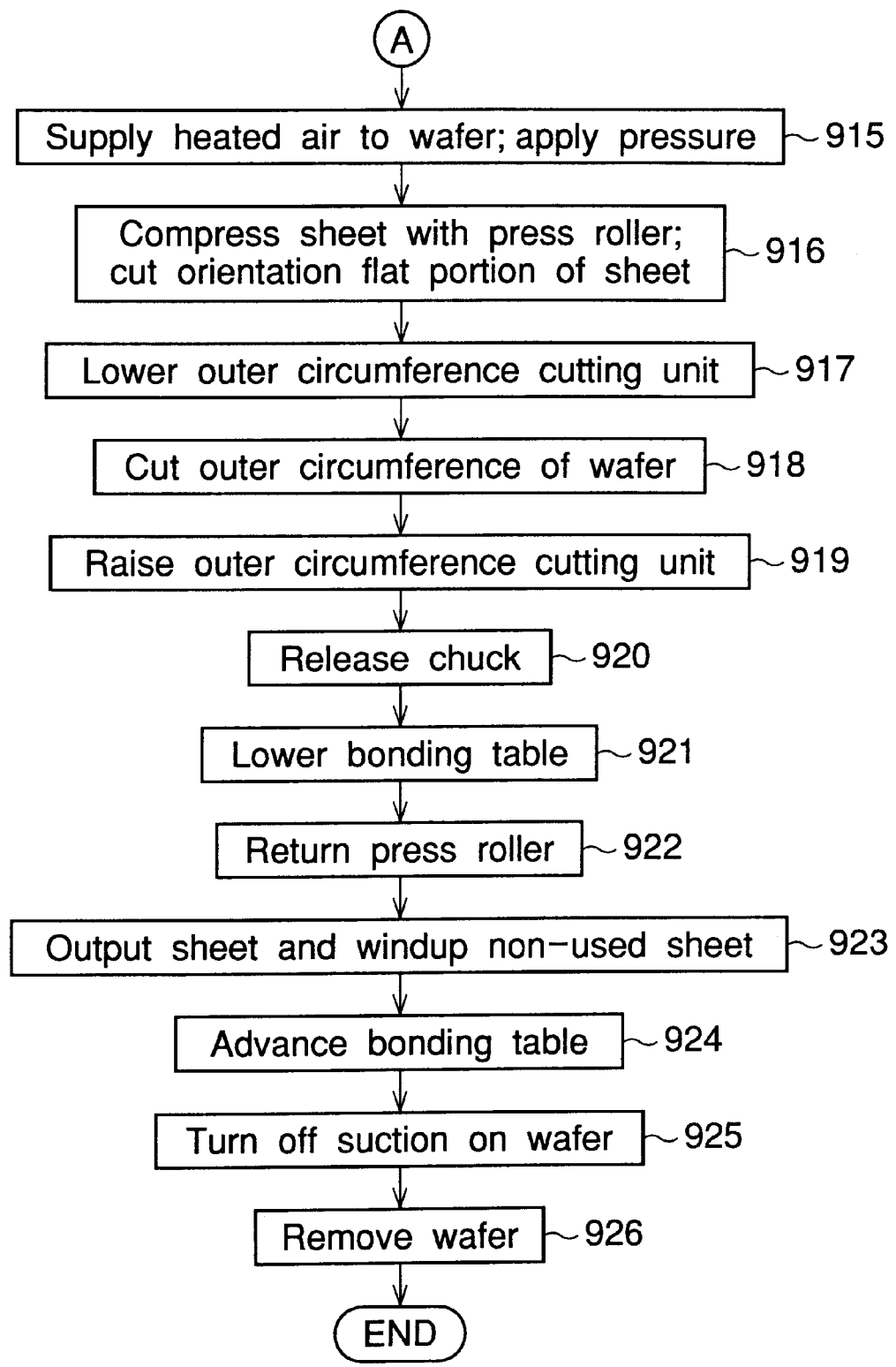

Next, the operation of the adhesive sheet applying apparatus according to the above embodiment of the present invention will be described with reference to the flow chart shown in FIGS. 12 and 13.

First, the bonding table 201 is moved forward and a wafer W is placed onto the bonding table 201 with rear surface of the wafer W facing up (Step 901). In this connection, the placement of the wafer W can be carried out manually by an operator using the jig plate 271 (see FIG. 6), or automatically by a robot or the like. After the wafer W is set in place, the bonding table 201 is moved backward into the inside of the adhesive sheet applying apparatus (Step 902). Then, the heating unit 202 is moved forward (Step 903), from its standby position shown by the dashed lines in FIG. 4, and then downward to a position at the bonding table 201 (Step 904). Next, the wafer W is held by suction to the heating unit 202 (Step 905), and the heating unit 202 is moved upward (Step 906). At this time, the chuck 209 grasps both edge portions of the adhesive sheet S and thereby stretches the adhesive sheet S in the widthwise direction thereof (Step 907).

Next, while the heating unit is held in a raised state, a current is passed through the heaters 234 to heat the wafer W to a prescribed temperature (Step 908). In this way, by heating the wafer W while it is separated from the bonding table 201, it is possible to prevent the bonding table 201 from being heated to high temperature, and this makes it much easier for an operator to place wafers W on the bonding table 201 (i.e., the bonding table 201 is prevented from becoming a danger or hindrance to the operator).

After the wafer W is heated, the heating unit 202 is lowered (Step 909), and then the suction is turned off and the heated wafer W is returned to the bonding table 201 (Step 910). At the same time, the heater 273 of the bonding table 201 is operated to keep the wafer W at the prescribed temperature. Next, the wafer W is held with suction by the bonding table 201 (Step 911), the heating unit 202 is returned to the inside of the box 3 (Step 912), and the bonding table 201 is raised (Step 913). When this is done, the raising of the bonding table 201 causes the press roller 205 to press the adhesive sheet S (Step 914), and then warm air is supplied under pressure to the concave portion of the bonding table 201 (Step 915). Then, the press roller 203 is moved from its home position H (see FIG. 3) to apply the adhesive sheet S to the wafer W. At this time, after the cutter blade 253a reaches the position of the orientation flat portion of the wafer W, the cylinder 278 is driven to move the cutting head 274 downward in a slanting direction, whereby the adhesive sheet of the orientation portion of the wafer W is cut off by the cutter blade 253a (Step 916). Then after cutting blade has passed through the orientation portion, the cutting head 274 is raised.

Next, the outer circumference cutting unit 204 is lowered (Step 917), and the adhesive sheet of the outer circumference of the wafer W is cut off (Step 918). In this regard, such cutting operation may be carried out manually or automatically. Next, the outer circumference cutting unit 204 is raised (Step 919), the chuck 209 is released (Step 920), the bonding table 201 is lowered (Step 921), and the press roller 203 is returned to its home position H (Step 922). Next, a new adhesive sheet S is outputted while the unnecessary part of the sheet is wound up (Step 923), the bond table 201 is moved forward (Step 924), the suction on the wafer W is released (Step 925), and the wafer W is unloaded (Step 926). In this regard, the unloading of the wafer W can be carried out manually or automatically.

In this connection, it is to be noted that the present invention is not limited to the use of the heating unit 202 as a wafer heating means, and instead it is possible to employ other wafer heating means. For example, when using a bonding table which does not have a concave portion, a heater can be provided inside the bonding table to heat the wafer. In such case, there is no need for the heating unit 202 described in the embodiment above. Further, various other heating means may be employed, such as a heating means which uses hot air, infrared radiation or the like.

Further, instead of heating the wafer W, it is possible to directly heat the adhesive sheet. In such case, the adhesive sheet S is preferably provided with the release film 106. This can be carried out, for example, by providing a heating unit between the unwinding roller 101 (see FIG. 3) and the roller 107, with the adhesive being heated either from the side of the base material 104 or the side of the release film 106. In such case, it is possible to carry out heating on a length of adhesive sheet which matches the size of the wafer W, with the adhesive sheet being heated to a high enough temperature so as to take into account the drop in temperature that will occur as the adhesive sheet is transported to the bonding table.

It should also be noted that the adhesive applying apparatus according to the present invention is not limited to the application of adhesive sheets to semiconductor wafers, and instead may be adapted for a wide variety of used. For example, for semiconductor devices, the apparatus according to the present invention can be used to apply seal improving films for improving the seal between the sealant resin and the underside surface of a chip, passivation films, layer insulating films, a-ray cut-off films, pattern forming films, die pad adhesive films and the like. Further, the apparatus according to the present invention can be used to apply films on plate-shaped materials or substrates other than semiconductor devices, such as liquid crystal orientation films, printed circuit board protection films, X-ray exposure masking films and the like.

In this way, by heating the plate-shaped material or the adhesive sheet, the apparatus and method of the present invention makes it possible to reliably bond an adhesive sheet to the plate-shaped material.

Finally, it is to be understood that many changes and additions may be made to the embodiments described above without departing from the scope and spirit of the invention as defined by the appended claims.

What is claimed is:

1. A method of applying an adhesive sheet which includes a thermoplastic resin to a plate-shaped material, comprising the steps of:

placing the plate-shaped material on a peripheral support member having a double wall and a gap between the double wall;

applying a vacuum within the gap so as to adhere the plate-shaped material to the peripheral support member;

heating the plate-shaped material; and applying the adhesive sheet under pressure to the plate-shaped material.

2. The method of claim 1, wherein the peripheral support member includes an annular member.

3. The method of applying an adhesive sheet according to claim 1, wherein the peripheral support member further defines an enclosed cavity, further comprising applying a gas pressure to the plate-shaped material, thereby preventing the plate-shaped material from warping.

4. A method of applying an adhesive sheet which includes a thermoplastic resin to a plate-shaped material, comprising the steps of:

placing the plate-shaped material on a peripheral support member having a double wall and a gap between the double wall;

applying a vacuum within the gap so as to adhere a periphery of the plateshaped material to the peripheral support member;

heating the adhesive sheet; and applying the adhesive sheet under pressure to the plate-shaped material.

5. The method of claim 4, wherein the peripheral support member includes an annular member.

6. The method of applying an adhesive sheet according to claim 4, wherein the peripheral support member further defines an enclosed cavity, further comprising applying a gas pressure to the plate-shaped material, thereby preventing the plate-shaped material from warping.

7. An apparatus for applying an adhesive sheet which includes a thermoplastic resin to a plate-shaped material, comprising:

plate-shaped material mounting means;

heating means; and adhesive sheet applying means for applying the adhesive sheet to the plate-shaped material, wherein the plate-shaped material mounting means includes a bonding table having an outer circumferential suction portion for holding the plate-shaped material by suction, and a central concave portion which can be supplied with compressed air.

8. The apparatus of claim 7, wherein the plate-shaped material is a semiconductor wafer and the plate-shaped material mounting means includes a semiconductor wafer mounting means.

9. The apparatus of claim 8, wherein the heating means is adapted to heat the semiconductor wafer.

10. The apparatus of claim 9, wherein the heating means includes suction means to hold the semiconductor wafer.

11. The apparatus of claim 8, wherein the heating means is adapted to heat the adhesive sheet.

12. The apparatus of claim 8, wherein the adhesive sheet is made from a heat resistant resin.

13. The apparatus of claim 12, wherein the heat resistant resin is a fluorine base resin or polyimide base resin.

14. The apparatus of claim 8, wherein the heating means is provided inside the semiconductor wafer mounting means.

15. The apparatus of claim 8, further comprising a compression means for applying the adhesive sheet under pressure to the semiconductor wafer.

16. The apparatus of claim 15, wherein the compression means includes at least one press roller.

17. An apparatus for applying an adhesive sheet which includes a thermoplastic resin to a plate-shaped material, comprising:

plate-shaped material mounting means;

heating means; and adhesive sheet applying means for applying the adhesive sheet to the plate-shaped material, wherein the plate-shaped material mounting means includes a bonding table having a peripheral suction portion for holding a periphery of the plate-shaped material on the mounting means by suction.

18. The apparatus of claim 17, wherein a vacuum pump is operably coupled to the peripheral suction portion.

19. The apparatus of claim 17, wherein the peripheral suction portion seals the plate-shaped material to the mounting means to define a cavity for retaining compressed gas to support the plate-shaped material.

20. The apparatus of claim 19, wherein an air supply pump is operably coupled to the cavity.

* * * * *

UNITED STATES PATENT AND TRADEMARK OFFICE
CERTIFICATE OF CORRECTION

PATENT NO. : 5,961,768
DATED : October 5, 1999
INVENTOR(S) : Tsujimoto

It is certified that error appears in the above-identified patent and that said Letters Patent is hereby corrected as shown below:

Column 6,
Line 26, "slut" should read -- slit --.
Line 37, "arc" should read -- are --.

Column 10,
Line 17, "used." should read -- uses. --.
Line 22, "a-ray" should read -- α-ray --.

Signed and Sealed this

Twenty-third Day of July, 2002

Attest:

Attesting Officer

JAMES E. ROGAN
Director of the United States Patent and Trademark Office